(12) United States Patent
Moriai et al.

(10) Patent No.: US 7,652,554 B2
(45) Date of Patent: *Jan. 26, 2010

(54) MULTILAYER FILTER

(75) Inventors: Katsunari Moriai, Nikaho (JP); Dai Matsuoka, Tokyo (JP); Takahiro Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 217 days.

This patent is subject to a terminal disclaimer.

(21) Appl. No.: 11/414,261

(22) Filed: May 1, 2006

(65) Prior Publication Data

US 2006/0261914 A1 Nov. 23, 2006

(30) Foreign Application Priority Data

May 2, 2005 (JP) ............................ P2005-134510

(51) Int. Cl.
    *H01C 7/00* (2006.01)
(52) U.S. Cl. ........................................ 338/61; 361/118
(58) Field of Classification Search ............... 338/61, 338/64; 361/118, 119
    See application file for complete search history.

(56) References Cited

U.S. PATENT DOCUMENTS

| 5,723,395 A | 3/1998 | Suzuki et al. |
| 7,085,118 B2 | 8/2006 | Inoue et al. |

FOREIGN PATENT DOCUMENTS

| CN | 1542873 | 11/2004 |
| JP | 03274815 | * 12/1991 |
| JP | A 05-190315 | 7/1993 |
| JP | A 05-335132 | 12/1993 |
| JP | A 06-275466 | 9/1994 |
| JP | A 7-220906 | 8/1995 |
| JP | A 08-91920 | 4/1996 |
| JP | A 08-250309 | 9/1996 |
| JP | A 10-335115 | 12/1998 |
| JP | A 2000-77265 | 3/2000 |
| JP | A 2000-124022 | 4/2000 |
| JP | A 2004-152824 | 5/2004 |
| JP | A 2004-311877 | 11/2004 |
| JP | A 2006-245258 | 9/2006 |

(Continued)

OTHER PUBLICATIONS

Notice of Office Action issued on Jan. 15, 2008 for corresponding Japanese Patent Application No. 2005-134510.

*Primary Examiner*—Kyung Lee
(74) *Attorney, Agent, or Firm*—Oliff & Berridge, PLC

(57) ABSTRACT

An object of the present invention is to provide a multilayer filter constructed so as to be less likely to suffer peeling between a varistor part and an inductor part. A multilayer filter 10 as a preferred embodiment has a structure in which a varistor part 20 and an inductor part are stacked. The varistor part 30 consists of a stack of varistor layers 31, 32 with internal electrodes 31*a*, 32*a*, and the varistor layers contain ZnO as a principal component, and contain at least one element selected from the group consisting of Pr and Bi, Co, and Al as additives. The inductor part 20 consists of a stack of inductor layers 21-24 with conductor patterns 21*a*-24*a*, and the inductor layers contain ZnO as a principal component and substantially contain neither Co nor Al.

4 Claims, 9 Drawing Sheets

FOREIGN PATENT DOCUMENTS

| | | |
|---|---|---|
| KR | A 2001-0022821 | 3/2001 |
| KR | A-2003-0070788 | 9/2003 |
| KR | 2004-0106235 | 12/2004 |
| TW | 444431 | 7/2001 |
| WO | WO 2006/046361 A1 | 5/2006 |

* cited by examiner

MULTILAYER FILTER

BACKGROUND OF THE INVENTION

1. Field of the Invention

The present invention relates to a multilayer filter and, more particularly, to a multilayer filter consisting of a stack of a varistor part and an inductor part.

2. Related Background Art

In recent years, electronic devices have been and are being developed toward higher frequencies of transmitted signals for fast operation, toward lower voltages for power saving, and so on. Under such circumstances, the technology of removing noise, surge, etc. is becoming more and more important for the electronic devices, in terms of securing excellent reliability. Then a multilayer filter consisting of a stack of a varistor part and an inductor part is drawing attention as an element capable of removing both noise and surge by a single chip.

One of the known multilayer filters of this type is a composite function element obtained by joining a ceramic porcelain and a magnetic material porcelain and integrally sintering them (e.g., reference is made to Japanese Patent Application Laid-Open No. 7-220906).

SUMMARY OF THE INVENTION

In the foregoing conventional multilayer filter, however, the varistor part and the inductor part are different in materials making their elements, and thus levels of volume changes of them are largely different during the sintering. For this reason, there was such a tendency that stress easily occurred at the boundary between them during the integral sintering. Then this posed the problem that the varistor part and the inductor part were easy to peel off from each other.

The present invention has been accomplished in light of such circumstances, and an object of the invention is therefore to provide a multilayer filter constructed so as to be unlikely to suffer peeling between the varistor part and the inductor part.

The Inventors first conducted an attempt to make the inductor part of the same material as the element making the varistor part, in the multilayer filter, in order to reduce the peeling between the varistor part and the inductor part. As a result, it is found that the varistor part and the inductor part became extremely resistant to peeling even if they were integrally sintered.

However, the material making the element of the varistor part normally had a characteristic of extremely low resistance and was thus ill-suited for the material of the inductor. For this reason, it was difficult to apply the multilayer filter of this type to high-frequency use.

Then the Inventors conducted further research on the basis of the above knowledge and discovered that when the inductor part was comprised of the element of the same material as the constituent material of the varistor part and if different additives were added in the two constituent materials, the element of the inductor part came to have high resistance, thereby completing the present invention.

Namely, a multilayer filter of the present invention is a multilayer filter comprising a stack of a varistor part comprised of a conductor layer and a varistor layer, and an inductor part comprised of a conductor layer and an inductor layer, wherein the varistor layer comprises ZnO as a principal component, and comprises at least one element selected from the group consisting of Pr and Bi, Co, and Al as additives, and wherein the inductor layer comprises ZnO as a principal component and substantially comprises neither Co nor Al.

In the multilayer filter according to the present invention, as described above, the elements of the varistor layer and inductor layer comprise the same material (ZnO) as a principal component. Therefore, even in the case where these are integrally sintered, the stress or the like based on the difference between volume change rates of the elements during sintering is less likely to occur between the two layers. As a result, the peeling is drastically reduced between the varistor part and the inductor part.

The material making the inductor layer, i.e., the material comprising ZnO as a principal component and substantially comprising neither Co nor Al, has characteristics of extremely high resistivity and low dielectric constant, when compared with a ZnO single body and the constituent material of the varistor layer (ZnO with additives of Pr or Bi, Co, and Al). Therefore, the inductor layer comprising the material comes to have excellent inductor characteristics.

More preferably, the multilayer filter of the present invention further comprises Li diffused from a surface to an interior. This makes the inductor part in the multilayer filter have much superior inductor characteristics. As a result, the multilayer filter becomes much superior in the characteristics to absorb noise and surge.

DESCRIPTION OF THE PREFERRED EMBODIMENTS

Figure 1:
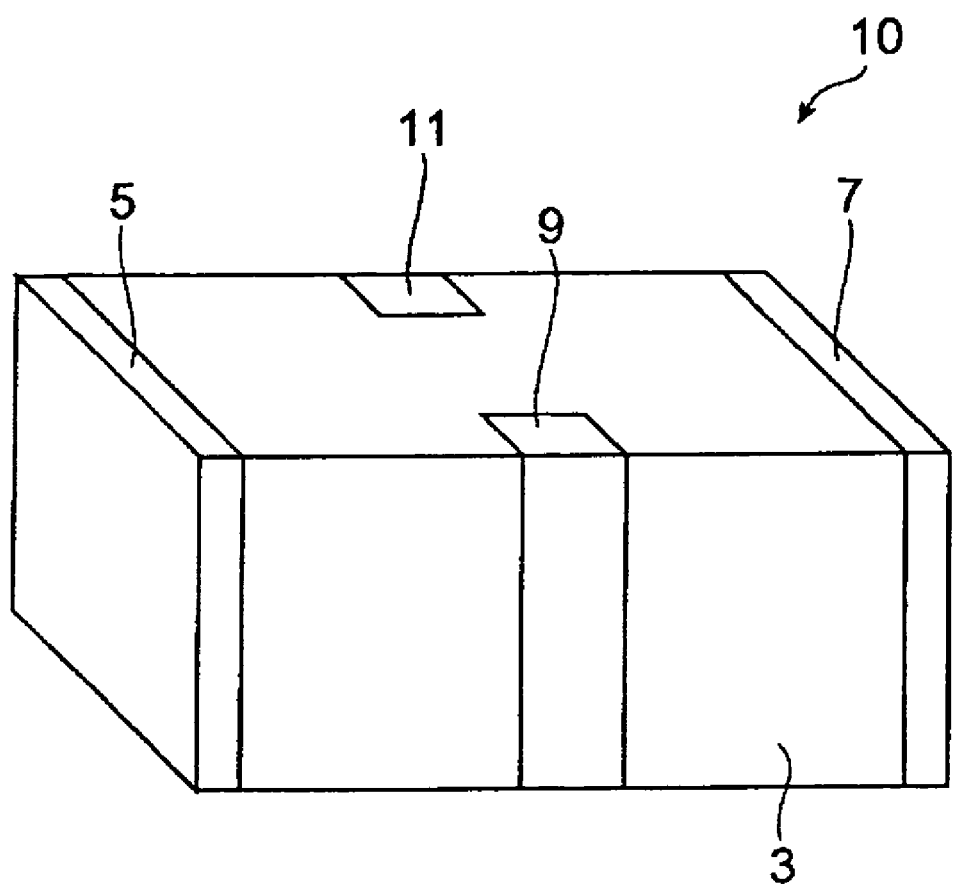
FIG. 1 is a perspective view showing a multilayer filter of an embodiment.

Preferred embodiments of the present invention will be described below in detail with reference to the drawings. The same elements will be denoted by the same reference symbols throughout the drawings, without redundant description. The positional relations such as vertical and lateral relations in the description are based on the positional relations in the drawings.

First, a structure of multilayer filter 10 according to the first embodiment will be described with reference to FIGS. 1 to 3.

FIG. 1 is a perspective view showing the multilayer filter of the first embodiment. The multilayer filter 10 has a pair of input/output electrodes 5, 7 formed at two longitudinal ends of element 3, and a pair of ground electrodes 9, 11 formed on side faces of the same element 3. When the multilayer filter 10 is mounted on an external substrate (not shown), the bottom face of the element 3 is a face opposed to the external substrate.

Figure 2:
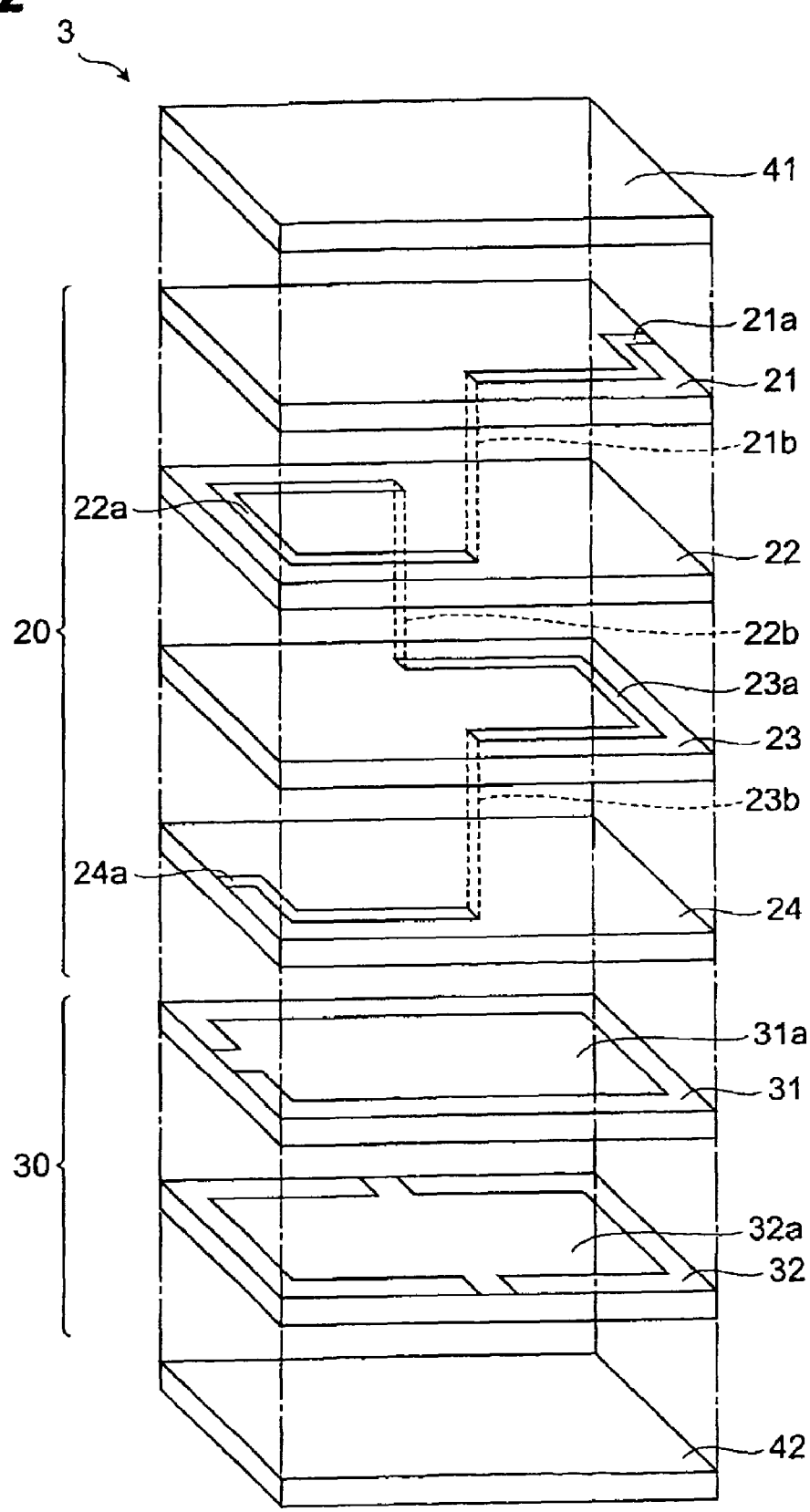
FIG. 2 is an exploded perspective view showing element parts of the multilayer filter.

FIG. 2 is an exploded perspective view showing element parts of the multilayer filter. As illustrated, the element 3 in the multilayer filter 10 has a structure in which a stack structure consisting of inductor part 20 and varistor part 30 is sandwiched between a pair of protecting layers 41, 42.

The inductor part 20 is a stack of inductor layers 21, 22, 23, 24 provided with their respective conductor patterns 21a, 22a, 23a, 24a (conductor layers). The conductor patterns 21a, 22a, 23a, 24a in the respective layers form a part of a spiral coil pattern. The coil pattern is constructed by sequentially connecting these patterns by through electrodes 21b, 22b, 23b. As described above, the inductor part 20 has the structure including the coil L (cf. FIG. 3).

The conductor pattern 21a has an end drawn out to an end of inductor layer 21, and it constitutes one end of the coil pattern. This end of the coil pattern (conductor pattern 21a) is drawn out to an edge of the element 3 to be electrically connected to one input/output electrode 7.

The conductor pattern 24a has an end drawn out to an end of inductor layer 24, and it constitutes another end of the coil pattern. This end of the coil pattern (conductor pattern 24a) is drawn out to an edge opposite to the foregoing one end in the element 3, to be electrically connected to another input/output electrode 5.

The conductor patterns 21a-24a are made of a metal material or the like used as a constituent material of the coil pattern of the inductor. Each inductor layer 21, 22, 23, 24 making the inductor part 20 is made of a ceramic material consisting primarily of ZnO.

The ceramic material making the inductor layers 21-24 may contain a metal element such as Pr, K, Na, Cs, or Rb as an additive, in addition to ZnO. Among others, Pr is particularly preferred as an additive. When the ceramic material contains the additive of Pr, the difference between the volume change rates of the inductor layers 21-24 and after-described varistor layers 31, 32 can be readily reduced. The inductor layers 21-24 may further contain Cr, Ca, or Si for the purpose of improving the bonding property to after-described varistor part 30. These metal elements in the inductor layers 21-24 can exist in various forms such as a single metal and an oxide. A preferred content of the additive or additives in the inductor layers 21-24 is preferably not less than 0.02 mol % nor more than 2 mol %, relative to the total amount of ZnO in the inductor layers. The content of these metal elements can be measured, for example, by an inductively-coupled high-frequency plasma emission spectrometer (ICP).

The inductor layers 21-24 of the above configuration substantially contain neither Co nor Al, while Co and Al are contained in the after-described varistor layers 31, 32. Here the state of "substantially contain neither" refers to a state in a case where these elements are not deliberately added as raw materials on the occasion of forming the inductor layers 21-24. For example, a case where these elements are undeliberately contained by virtue of diffusion or the like from the varistor part 30 into the inductor part 20 corresponds to the state of "substantially contain neither." The inductor layers 21-24 may further contain other metal elements or the like for the purpose of further improving the characteristics or the like, as long as the above condition is met.

The varistor part 30 consists of a stack of varistor layers 31, 32 provided with their respective internal electrodes 31a, 32a (conductor layers). The internal electrodes 31a, 32a are formed in an approximately rectangular shape on the varistor layers 31, 32, respectively. These are arranged to overlap across the almost entire surface in the stack direction. A part of the internal electrode 31a is drawn out to an edge of varistor layer 31 forming a side face of the element 3 to be electrically connected to input/output electrode 5.

The internal electrode 32a is drawn out to both sides of edges perpendicular to the edge to which the internal electrode 31a is drawn out, and it is electrically connected through the drawn-out portions to respective ground electrodes 9, 11. In this manner, varistor V (cf. FIG. 3) is comprised of the internal electrodes 31a, 32a, and the varistor layer 31 disposed between them, in the varistor part 30.

The internal electrodes 31a, 32a can be made of Pd or Ag—Pd alloy or the like which is normally used for the internal electrodes of the varistor.

The varistor layers 31, 32 are made of a ceramic material consisting primarily of ZnO. This ceramic material further contains at least one element selected from the group consisting of Pr and Bi, Co, and Al as additives. Since the varistor layers 31, 32 contain Co in addition to Pr, they have excellent voltage nonlinearity, i.e., varistor property and have a high dielectric constant ($\in$). Since they further contain Al, they have a low resistance. Conversely, the aforementioned inductor layers 21-24 contain neither Co nor Al, and thus have no varistor property and have a low dielectric constant and high resistivity, which are favorable characteristics as the constituent material of the inductor part.

These metal elements as additives can exist in forms of a single metal, an oxide, and so on in the varistor layers 31, 32. The varistor layers 31, 32 may further contain metal elements or the like (e.g., Cr, Ca, Si, K, and so on) other than the aforementioned elements as additives.

The inductor layers 21-24 in the aforementioned inductor part 20 further contain Li internally. However, this Li is not added as, a raw material in these layers, but it is added as follows: in a production method described later, a laminate with inductor part 20 and varistor part 30 is formed, and thereafter a raw material containing Li is attached to a surface of this laminate, followed by diffusion of it. However, in the varistor part 30 the region of varistor layer 31 between the internal electrode 31a and the internal electrode 32a exhibits the varistor property, and it is desirable to minimize the amount of Li in this region. Since in the present embodiment Li is diffused from the surface of the laminate as described above, an amount of Li diffused into the foregoing region of the varistor layer 31 is extremely small, and this region is in a state in which Li is substantially not contained. The multilayer filter 10 does not always have to be one having Li diffused.

Protecting layers 41, 42 are layers each made of a ceramic material and protect the inductor part 20 and varistor part 30 in a state in which the laminate structure consisting of the inductor part 20 and varistor part 30 is sandwiched between them from both sides in the stack direction. There are no particular restrictions on the constituent material of the protecting layers 41, 42, and a variety of ceramic materials or the like are applicable. A material containing ZnO as a principal component is preferably applicable in terms of reduction of peeling from the aforementioned laminate structure.

Figure 3:
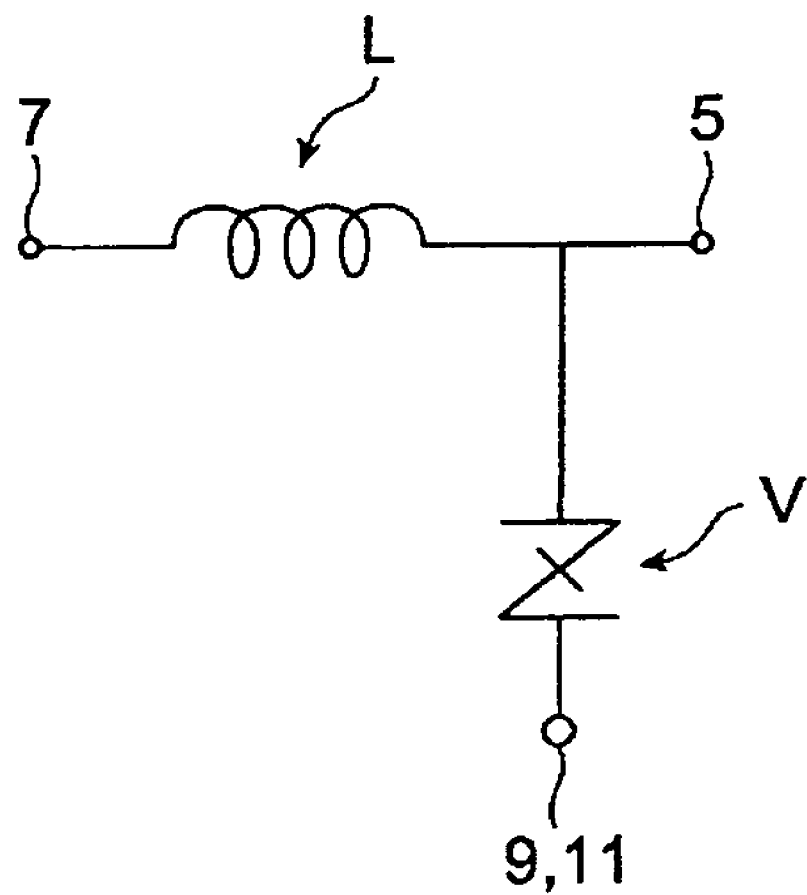
FIG. 3 is an illustration for explaining an equivalent circuit of the multilayer filter of the embodiment.

FIG. 3 is an illustration for explaining an equivalent circuit of the multilayer filter of the embodiment. The multilayer filter 10 having the above-described configuration constitutes the equivalent circuit as shown in FIG. 3. Namely, the multilayer filter 10 constitutes an L-type circuit of inductor L and varistor V.

Next, a method of producing the multilayer filter of the present embodiment will be described with reference to FIG. 4.

Figure 4:
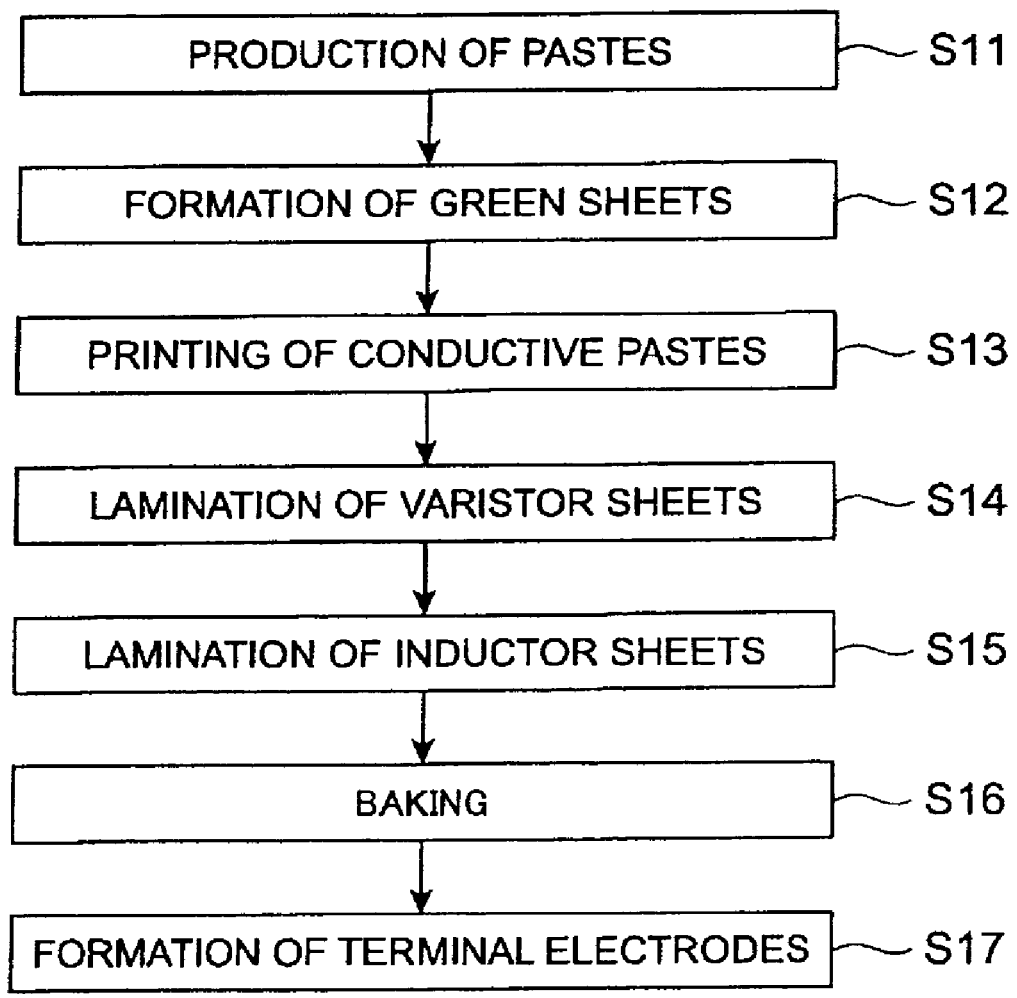
FIG. 4 is a flowchart for explaining steps of producing the multilayer filter of the embodiment.

FIG. 4 is a flowchart for explaining steps of producing the multilayer filter of the embodiment. In the production of the multilayer filter 10, the first step is to produce pastes containing the ceramic materials as raw materials for the inductor layers 21-24 and for the varistor layers 31, 32 (step S11). Specifically, the paste for formation of the varistor layers can be prepared by adding to ZnO of the principal component, additives of at least one element selected from the group consisting of Pr and Bi, Co, and Al and optional additives of Cr, Ca, Si, K, etc. according to need by desired contents after baked, adding a binder and others into them, and mixing them. The metal elements in this case can be added in the form of oxides, for example.

The paste for formation of the inductor layers can be prepared by adding to ZnO as the principal component, optional metal elements of Pr, Bi, etc. as additives according to need, adding a binder and others into them, and mixing them. Neither Co nor Al is added into the paste for formation of the inductor layers, different from the paste for formation of the varistor layers. Here the above metal elements can be added in compound forms such as oxide, oxalate, and carbonate. Amounts of these additives are adjusted so that the metal elements are contained in the desired content as described above, in the element 3 after baked as described later.

These pastes are applied onto plastic film or the like by the doctor blade method or the like, and thereafter dried to form green sheets of the ceramic materials (step S12). This obtains a predetermined number of green sheets for formation of inductor layers 21-24 (hereinafter referred to as "inductor sheets") and a predetermined number of green sheets for formation of varistor layers 31, 32 (hereinafter referred to as "varistor sheets"). Then through holes are formed at desired locations by a laser or punching or the like in the obtained inductor sheets. In the above formation of the green sheets, the plastic film or the like may be peeled off from each sheet immediately after the application and drying, or may be peeled off immediately before a laminating step described later. In this step of forming the green sheets, in addition to these sheets, green sheets for formation of protecting layers 41, 42 containing ZnO are also formed in a method similar to the above.

Next, a conductive paste for formation of conductor patterns 21a-24a (inductor part 20) or for formation of internal electrodes 31a, 32a (varistor part 30) is screen-printed in a desired pattern for each sheet on the inductor sheets or on the varistor sheets (step S13). This obtains sheets provided with respective conductive paste layers having the desired patterns. For example, the conductive paste for formation of the conductor patterns can be a conductive paste consisting primarily of Pd or Ag—Pd alloy, and the paste for formation of the internal electrodes can be a conductive paste consisting primarily of Pd or Ag—Pd alloy.

Subsequently, the varistor sheets with the respective conductive paste layers corresponding to the internal electrodes 31a and 32a are successively stacked on a green sheet for formation of the protecting layer (step S14). Subsequently, the inductor sheets with the respective conductive paste layers corresponding to the conductor patterns 24a, 23a, 22a, and 21a are successively stacked on the varistor sheets (step S15). Furthermore, a green sheet for formation of the protecting layer is further stacked on the stack structure of the green sheets, and these are pressed to obtain a laminate as a precursor for element 3.

After that, the resultant laminate is cut into a chip unit in a desired size and thereafter this chip is baked at a predetermined temperature (e.g., 1000-1400° C.) to obtain the element 3 (step S16). Subsequently, Li is diffused from a surface of the obtained element 3 into the interior thereof. In this step, an Li compound is attached to the surface of the obtained element 3 and thereafter a heat treatment or the like is performed. The attachment of the Li compound can be performed using a hermetically closed rotary pot. There are no particular restrictions on the Li compound, but it is a compound that permits Li to diffuse from the surface of the element 3 to near the conductor patterns 21a-24a and the internal electrodes 31a, 32a by the heat treatment. Examples of such compounds include Li oxide, hydroxide, chloride, nitrate, borate, carbonate, oxalate, and so on. In the production of the multilayer filter 10, this Li diffusion step is not always essential.

Then a paste consisting primarily of silver is transferred onto the side faces of the Li-diffused element 3, thereafter baked, and further plated to form the input/output electrodes 5, 7 and ground electrodes 9, 11, thereby obtaining the multilayer filter 10 (step S17). The plating can be electroplating. Raw materials can be, for example, Cu and Ni and Sn, Ni and Sn, Ni and Au, Ni and Pd and Au, Ni and Pd and Ag, or Ni and Ag.

In the multilayer filter 10 of the above configuration, as described above, the inductor layers 21-24 and the varistor layers 31, 32 forming the inductor part 20 and the varistor part 30, respectively, both are made of their respective ceramic materials consisting primarily of ZnO. For this reason, the difference of volume change during the baking is extremely small between the inductor part 20 and the varistor part 30. Therefore, there will appear little strain, stress, or the like between them even if they are simultaneously baked. As a result, the resultant multilayer filter 10 becomes extremely resistant to peeling between the inductor part and the varistor part, when compared with the conventional multilayer filters in which the inductor part and the varistor part are made of different materials.

The inductor layers 21-24, as described above, are made of the ceramic material containing ZnO as a principal component and substantially containing neither Co nor Al as an additive. The material of this kind has a sufficiently high resistivity as a constituent material of the inductor. Specifically, the material is likely to have a resistivity over 1 MΩ which is high enough for the inductor material. For this reason, the inductor part 20 is able to demonstrate excellent inductor characteristics even though it contains the principal component of ZnO which singly demonstrates an insufficient property in terms of resistivity.

Next, a multilayer filter according to the second embodiment will be described with reference to FIGS. 5 to 8.

Figure 5:
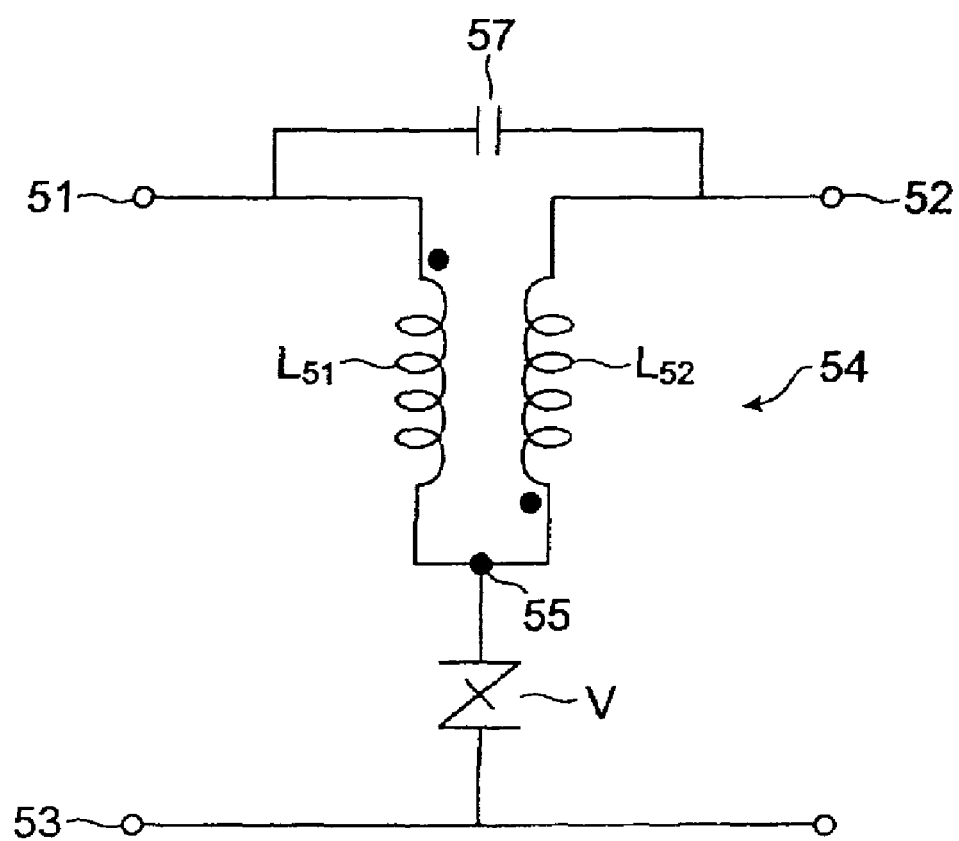
FIG. 5 is an illustration showing a circuit configuration of a multilayer filter according to a second embodiment.

FIG. 5 is an illustration showing a circuit configuration of the multilayer filter according to the second embodiment. As shown in FIG. 5, the multilayer filter of the present embodiment has a circuit configuration consisting of an input terminal 51, an output terminal 52, and a common terminal 53 for connection to the outside, a mutual induction element 54 consisting of coil $L_{51}$ and coil $L_{52}$, a capacitor 57, and a varistor V.

In this circuit, the input terminal 51, output terminal 52, and common terminal 53 are used for connection to the outside. The capacitor 57 is connected to the input terminal 51 and to the output terminal 52. In the mutual induction element 54, one terminal on the coil $L_{51}$ (primary) side is connected to the input terminal 51, and one terminal to be inversely induced on the coil $L_{52}$ (secondary) side is connected to the output terminal 52. The other terminals of the coil $L_{51}$ and the coil $L_{52}$ are connected at a connection terminal 55 to each other. The varistor V is connected at one terminal to the connection point (connection terminal 55) between the coil $L_{51}$ and the coil $L_{52}$ in the mutual induction element 54, and the other terminal thereof is connected to the common terminal 53.

In this circuit configuration, the input terminal 51 and the output terminal 52 may be replaced with each other. The common terminal 53 is preferably connected to the ground. The mutual induction element 54 can be constructed, for example, of a common-mode choke coil or transformer.

Figure 6:
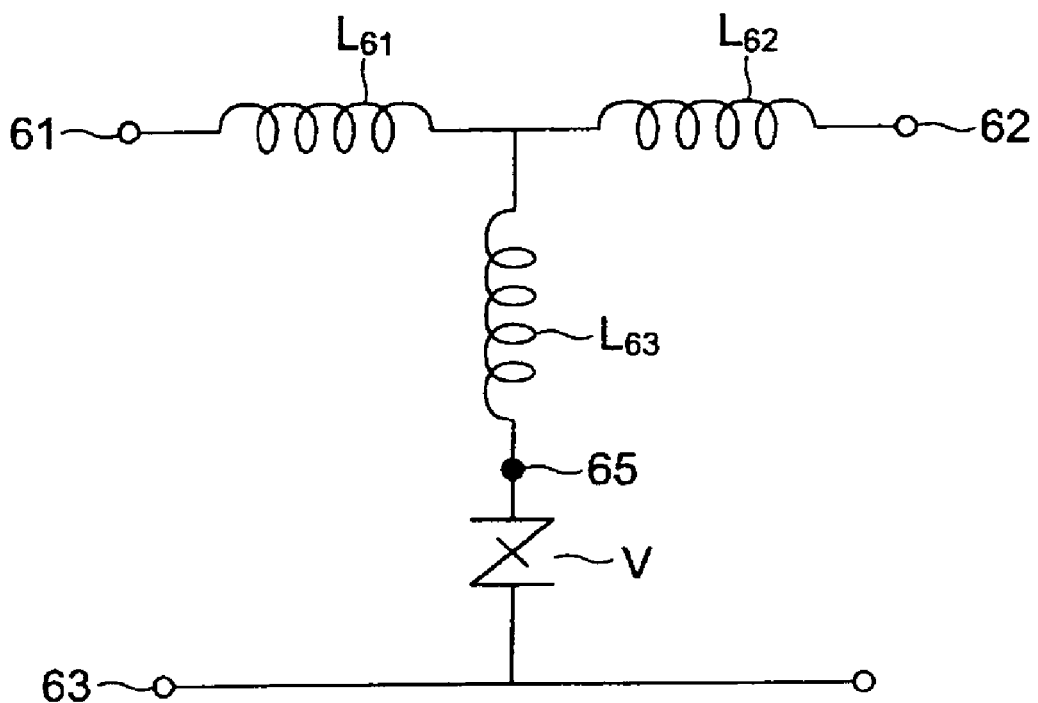
FIG. 6 is an illustration showing a circuit configuration as an equivalent transformation of the circuit configuration of FIG. 5.

Here the circuit configuration shown in FIG. 5 can be equivalently transformed into a circuit configuration shown in FIG. 6. FIG. 6 is a diagram showing the circuit configuration as an equivalent transformation from the circuit configuration of FIG. 5. This circuit configuration is comprised of an input terminal 61, an output terminal 62, a common terminal 63, a coil $L_{61}$, a coil $L_{62}$, a coil $L_{63}$, and a varistor V.

In this circuit, the input terminal 61, output terminal 62, and common terminal 63 are used for connection to the outside. The coil $L_{61}$ and coil $L_{62}$ are connected in series between the input terminal 61 and the output terminal 62. The coil $L_{63}$ and varistor V are connected in series at a connection terminal 65. Furthermore, the opposite terminal of coil $L_{63}$ to the connection terminal 65 is connected to a connection point between the coil $L_{61}$ and the coil $L_{62}$, and the opposite terminal of varistor V to the connection terminal 65 is connected to the common terminal 63.

Figure 7:
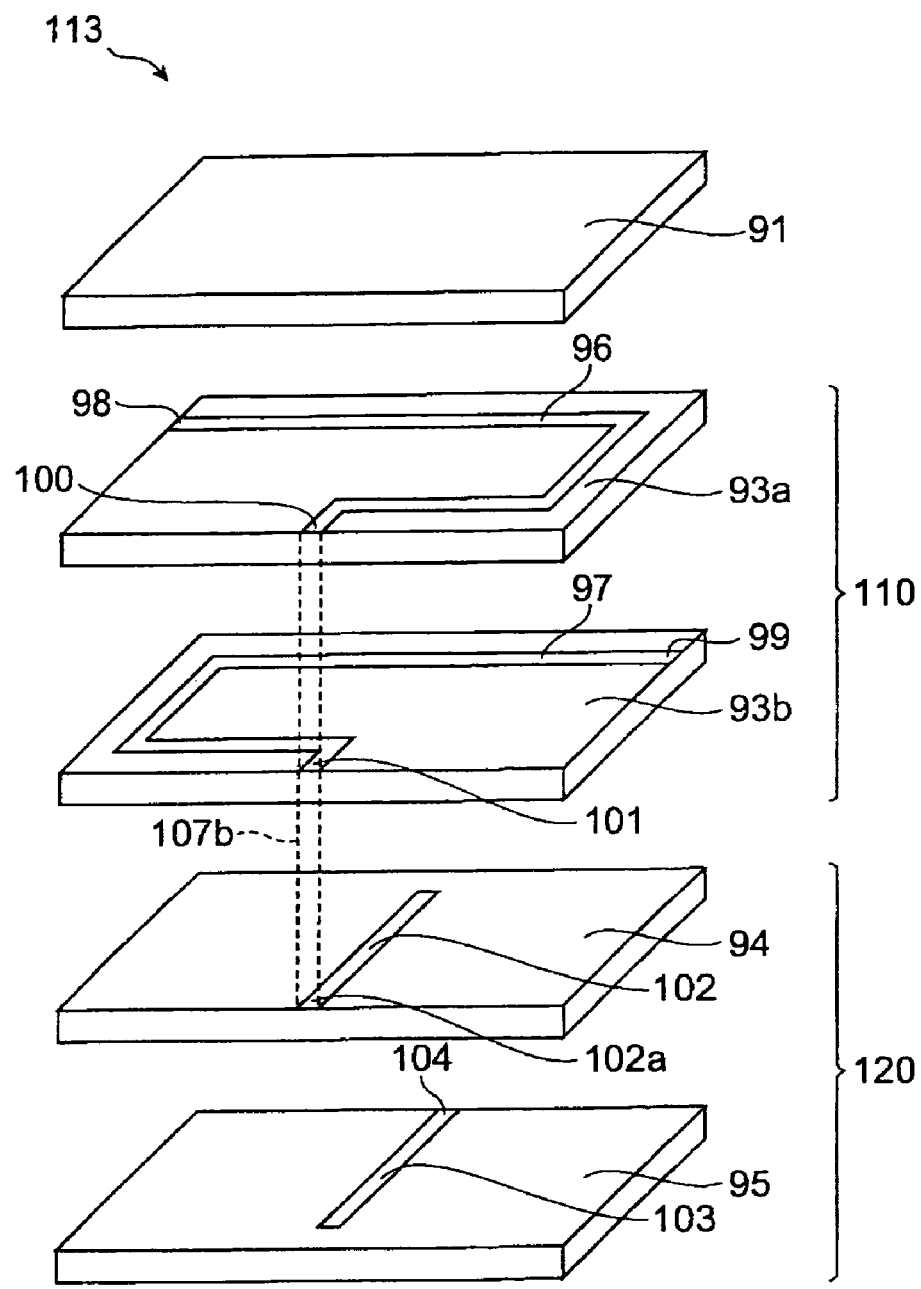
FIG. 7 is an exploded perspective view schematically showing element parts of the multilayer filter according to the second embodiment.
Figure 8:
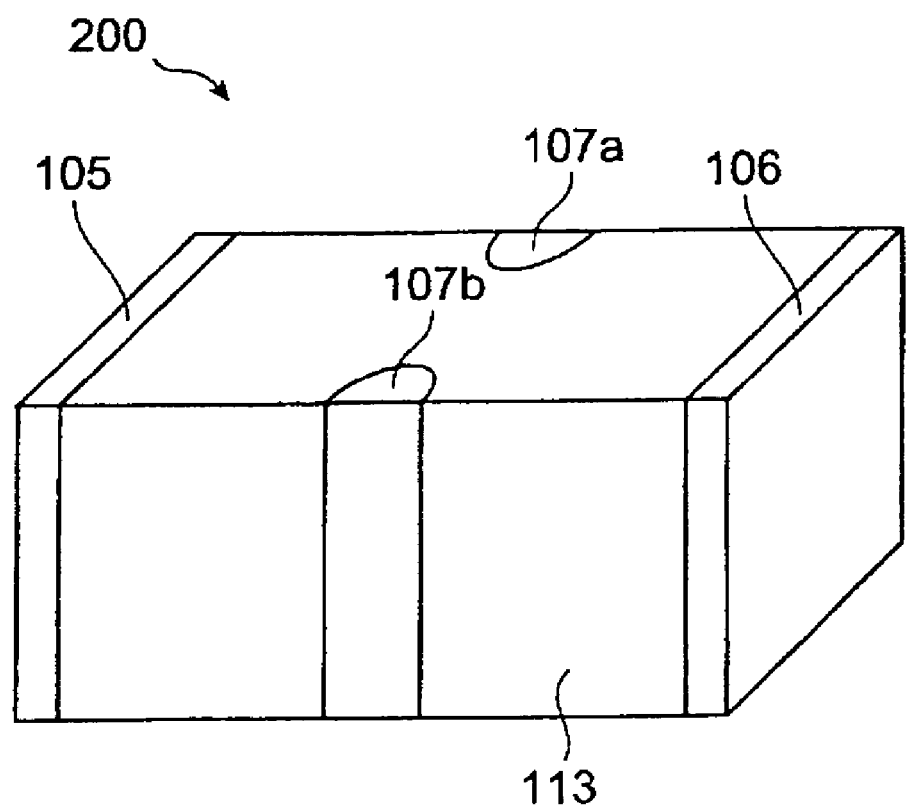
FIG. 8 is a perspective view showing a contour of the multilayer filter according to the second embodiment.

The multilayer filter of the second embodiment having the above-described circuit configuration has a structure as shown in FIGS. 7 and 8. FIG. 7 is an exploded perspective view showing the element part of the multilayer filter according to the second embodiment. FIG. 8 is a perspective view showing a contour of the multilayer filter according to the second embodiment. As shown in FIG. 7, the element part (element 113) of the multilayer filter 200 has a structure in which a varistor part 120, an inductor part 110, and a protecting layer 91 are stacked in order from bottom. As shown in FIG. 8, the multilayer filter 200 is provided with a pair of input/output electrodes 105, 106 formed at two longitudinal ends of the element 113, and with a common electrode 107a and a terminal electrode 107b similarly formed so as to face each other on side faces of the element 113. The common electrode 107a is a ground electrode connected to the ground (common terminal 53 or common terminal 63 in the above circuit configurations).

The inductor part 110 consists of a stack of inductor layers 93a, 93b provided with their respective conductor patterns 96, 97 (conductor layers). The conductor pattern 96 and the conductor pattern 97 constitute the primary-side coil $L_{51}$ (coil $L_{61}$) and the secondary-side coil $L_{52}$ (coil $L_{62}$) in the aforementioned circuit configurations. The constituent materials for the conductor patterns 96, 97 and for the inductor layers 93a, 93b in this inductor part 110 can be the same as the constituent materials of the conductor patterns 21a-24a and the inductor layers 21-24 in the aforementioned first embodiment.

One end 98 of the conductor pattern 96 is drawn out to one side of the inductor layer 93a to be connected to the input electrode 105. One end 99 of the conductor pattern 97 is drawn out to one side of the inductor layer 93b to be connected to the output electrode 106. The other ends 100, 101 of the conductor patterns 96, 97 both are connected to the terminal electrode 107b formed on the side faces of the element 113. In this manner, the conductor pattern 96 and the conductor pattern 97 constitute the mutual induction element 54. Furthermore, the conductor pattern 96 and the conductor pattern 97 are capacitively coupled in regions where they face each other, so as to constitute the capacitor 57 in the aforementioned circuit configuration. The conductor patterns 96 and 97 may be connected via a through hole or the like, instead of the terminal electrode as described above.

The varistor part 120 consists of a stack of varistor layers 94, 95 provided with their respective internal electrodes 102, 103. The internal electrode 102 has a pattern of a straight line type and is provided along the transverse direction of the varistor layer 94. One end 102a of this internal electrode 102 is drawn out to an edge of varistor layer 94 to be connected to the terminal electrode 107b formed on the side faces of the element 113. This results in connecting the internal electrode 102 to each of the ends 100, 101 of the conductor patterns 96, 97 (connection terminal 55 or connection terminal 65 in the aforementioned circuit configurations).

The internal electrode 103 has a pattern of a straight line type and is provided approximately in parallel with the internal electrode 102 along the transverse direction of the varistor layer 95. One end 104 of this internal electrode 103 is drawn out to an edge of varistor layer 95 to be connected to the common electrode 107a formed on the side faces of the element 113.

In the varistor part 120, the varistor V is comprised of the internal electrodes 102, 103, and varistor layer 94 provided between them. The constituent materials for the internal electrodes 102, 103 and for the varistor layers 94, 95 in the varistor part 120 can be the same as the constituent materials of the internal electrodes 31a, 32a and the varistor layers 31, 32 in the first embodiment described above.

Since the multilayer filter of the present embodiment in the above-described configuration also has the inductor layers and the varistor layers made of the same constituent materials as in the first embodiment, it is also resistant to peeling between the inductor part 110 and the varistor part 120. The inductor layers have a high resistance and can demonstrate excellent inductor characteristics even though they contain ZnO as a principal component.

Furthermore, since the multilayer filter of the present embodiment has the circuit configuration as shown in FIG. 5 or in FIG. 6, it is easy to achieve matching of an input impedance with a characteristic impedance. For this reason, the multilayer filter is also excellent in impedance matching for high-speed signals, for example, while enabling protection from static electricity of high voltage or the like.

The above described the preferred embodiments of the multilayer filters and production method thereof according to the present invention, but it is noted that the present invention is by no means limited to the above-described embodiments and that the present invention can be modified in various ways without departing from the spirit of the invention.

For example, the above embodiments exemplified the inductor part in the configuration in which the conductor patterns capable of forming the pattern of the coil shape were stacked, but, without having to be limited to this, the inductor part may also be, for example, one consisting of inductor layers with conductor patterns of straight line shape. Specifically, the inductor part may be formed by preparing an inductor layer with a linear conductor pattern connecting its both ends, and using this single layer or a plurality of such layers. In this case, the linear conductor pattern is provided along the direction to connect a pair of input/output electrodes in the multilayer filter. The inductor part of this configuration also has satisfactorily excellent inductor characteristics.

Furthermore, the multilayer filter of the present invention can be arbitrarily modified in its stack structure and in the forming locations of the electrodes and others as long as it can constitute one of the aforementioned equivalent circuits or one having the function equivalent thereto. Specifically, the foregoing embodiments exemplified the structure in which the inductor part was provided on the varistor part, but it is also possible, for example, to adopt a structure in which the inductor part is interposed between a pair of varistor parts. The positional relation of the input/output electrodes may be arbitrarily modified. It is also feasible to obtain the multilayer filter with excellent effect as described above, even in these structures.

The numbers of laminated layers in the inductor part and in the varistor part are not always limited to those in the above embodiments. Specifically, the number of turns in the coil pattern may be further increased, for example, by repeatedly stacking inductor layers with conductor patterns. It is also possible to further repeatedly stack varistor layers with internal electrodes. These numbers of stacked layers can be optionally adjusted according to the desired characteristics of the multilayer filter.

Incidentally, in a case where the conductor patterns are stacked in the inductor part of the multilayer filter and where the material making the inductor layers has a high dielectric constant, the conductor patterns adjacent in the stack direction are coupled to produce a parasitic capacitance between the conductor patterns. Therefore, the structure consisting of the stack of conductor patterns in the inductor part tends to be difficult to apply, particularly, to high-frequency use. From this point of view, the inductor layers preferably have a dielectric constant as low as possible, and, specifically, preferably have the relative dielectric constant of not more than 50.

EXAMPLES

The present invention will be described below in further detail with examples, but it is noted that the present invention by no means intended to be limited to these examples.

Example 1

(Fabrication of Multilayer Filter)

First, each of samples of the multilayer filter was produced according to the method described with FIG. 4 in the above embodiment. Specifically, the first step was to prepare the paste for formation of the varistor layers by adding $Pr_6O_{11}$, $CoO$, $Cr_2O_3$, $CaCO_3$, $SiO_2$, $K_2CO_3$, and $Al_2O_3$ into ZnO, and to prepare the paste for formation of the inductor layers by adding $Pr_6O_{11}$, $Cr_2O_3$, $CaCO_3$, $SiO_2$, and $K_2CO_3$ into ZnO.

Subsequently, these pastes were used to produce the varistor sheets and inductor sheets. Together with these, green sheets for formation of the protecting layer containing only ZnO were produced. Thereafter, the conductive paste for formation of the internal electrodes (varistor part) or for formation of the conductor patterns (inductor part) was applied onto each sheet by screen printing so as to achieve the pattern as shown in FIG. 2. The paste for formation of the internal electrodes was one containing Pd as a principal component, and the paste for formation of the conductor patterns was also one similarly containing Pd as a principal component.

Next, the sheets (varistor sheets and inductor sheets) each with the conductive paste applied were stacked in the order shown in FIG. 2, they were sandwiched from top and bottom between a pair of green sheets for formation of the protecting layers, and thereafter they were pressed to obtain a laminate being a precursor for the element. The laminate obtained in this manner was baked to form the element. Then an Ag paste was printed on this element to form the input/output electrodes and ground electrode, thereby obtaining samples of the multilayer filter having the structure shown in FIGS. 1 and 2.

Figure 9:
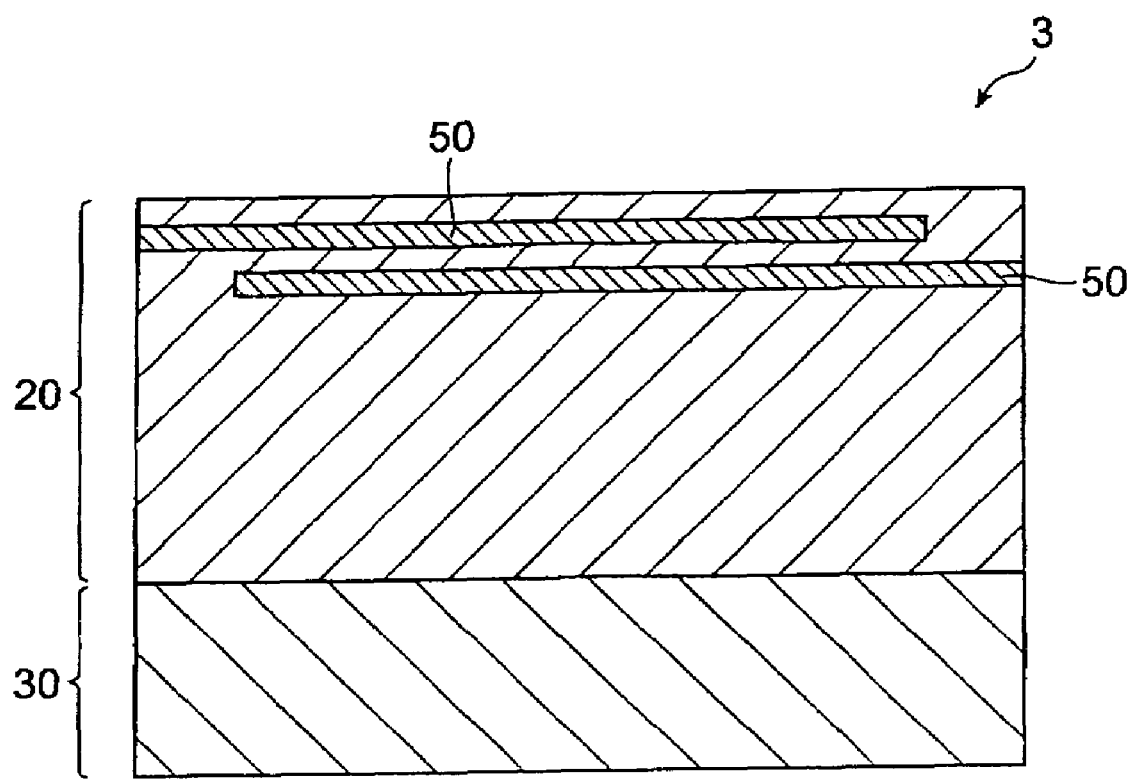
FIG. 9 is a view schematically showing a sectional structure of elements in a state in which internal electrodes are provided in an inductor part

In this example, in order to evaluate the characteristics of the inductor part as described below, a pair of internal electrodes disposed in parallel in the stack direction were provided in the inductor part in the multilayer filter of each sample. FIG. 9 is a view schematically showing a sectional structure of the element in a state in which the internal electrodes are provided in the inductor part. As illustrated, the internal electrodes 50 are provided so that one ends of the respective internal electrodes 50 are exposed in different opposed end faces of the element and that the other ends of the internal electrodes 50 overlap with each other in the stack direction. These internal electrodes are provided so as not to contact the conductor patterns forming the coil.

(Evaluation of Peeling between Inductor Part and Varistor Part)

The multilayer filters obtained by the above-described method were observed and no peeling was recognized between the inductor part and the varistor part in all the samples.

(Measurement of Relative Dielectric Constant and Resistivity of Inductor Part)

The obtained multilayer filters were used to measure the relative dielectric constant ($\in'$) and resistivity ($10^6$ Ωcm) of the inductor part in each sample. The measurements of relative dielectric constant and resistivity were carried out as described below.

Specifically, the relative dielectric constant ($\in'$) was determined as follows: a capacitance (C) of each sample was measured under the conditions of 1 MHz and the input signal level (measurement voltage) of 1 Vrms, using an impedance analyzer (4284A available from Hewlett-Packard Co.) and the result obtained was put into the equation of $\in' = Cd/\in_0 S$ to calculate the relative dielectric constant. Furthermore, the resistivity ($\rho$) was determined as follows: a resistance (R) of each sample was calculated from an electric current flowing upon application of a dc voltage of 1 V to each sample and the result obtained was put into the equation of $\rho = RS/d$ to calculate the resistivity. In the equations, $\in_0$ represents the dielectric constant of vacuum, d the distance between the internal electrodes 50 shown in FIG. 9, and S an overlapping area of the internal electrodes 50.

The above measurements provided the following results: the relative dielectric constants of the inductor part of 20-30 and the resistivity of $1 \times 10^6$ Ωcm.

As described above, it was confirmed that the multilayer filter having the varistor layers containing ZnO as a principal component and the additives of Pr, Co, and Al and the inductor layers containing ZnO as a principal component and substantially containing neither Co nor Al was extremely resistant to peeling between the varistor part and the inductor part. It was also confirmed that the inductor part in this multilayer filter had the relative dielectric constant below 50 and the resistivity over 1 MΩ and was thus adequately applicable to practical use as an inductor.

As described above, the present invention enables provision of the multilayer filter being resistant to peeling between the varistor part and the inductor part and having extremely good varistor characteristics and inductor characteristics.

What is claimed is:

1. A multilayer filter comprising a stack of a varistor part comprised of a conductor layer and a varistor layer, and an inductor part comprised of a conductor layer and an inductor layer, wherein the varistor layer comprises ZnO as a principal component, and comprises at least one element selected from the group consisting of Pr and Bi, Co, and Al as additives, and wherein the inductor layer comprises ZnO as a principal component and Pr, and substantially comprises neither Co nor Al.

2. The multilayer filter according to claim 1, further comprising Li diffused from a surface to an interior.

3. A multilayer filter comprising a stack of a varistor part comprised of a conductor layer and a varistor layer, and an inductor part comprised of a conductor layer and an inductor layer,
   wherein the varistor layer comprises ZnO as a principal component, and comprises at least one element selected from the group consisting of Pr and Bi, Co, and Al as additives,
   wherein the inductor layer consists of ZnO as a principal component and an additive which substantially comprises neither Co nor Al, and
   wherein the content of the additive in the inductor layer is not less than 0.02 mol % nor more than 2 mol % relative to the total amount of ZnO in the inductor layer.

4. A multilayer filter comprising a stack of a varistor part comprised of a conductor layer and a varistor layer, and an inductor part comprised of a conductor layer and an inductor layer,
   wherein the varistor layer comprises ZnO as a principal component, and comprises at least one element selected from the group consisting of Pr and Bi, Co, and Al as additives,
   wherein the inductor layer consists of ZnO as a principal component and an additive which comprises Pr and substantially comprises neither Co nor Al, and
   wherein the content of the additive in the inductor layer is not less than 0.02 mol % nor more than 2 mol % relative to the total amount of ZnO in the inductor layer.

* * * * *